(12) United States Patent
Wen et al.

(10) Patent No.: US 7,523,439 B2
(45) Date of Patent: Apr. 21, 2009

(54) DETERMINING POSITION ACCURACY OF DOUBLE EXPOSURE LITHOGRAPHY USING OPTICAL METROLOGY

(75) Inventors: Youxian Wen, Fremont, CA (US); Shifang Li, Pleasanton, CA (US)

(73) Assignee: Tokyo Electron Limited, Tokyo (JP)

( * ) Notice: Subject to any disclaimer, the term of this patent is extended or adjusted under 35 U.S.C. 154(b) by 326 days.

(21) Appl. No.: 11/485,045

(22) Filed: Jul. 11, 2006

(65) Prior Publication Data
US 2008/0016487 A1  Jan. 17, 2008

(51) Int. Cl.
*G06F 17/50* (2006.01)
(52) U.S. Cl. .......... 716/21; 382/145
(58) Field of Classification Search ......... 382/144–145, 382/151; 716/19–21; 700/121; 430/5, 54
See application file for complete search history.

(56) References Cited

U.S. PATENT DOCUMENTS

| | | | |
|---|---|---|---|
| 5,958,633 A * | 9/1999 | Miyatake | 430/5 |
| 6,710,847 B1 * | 3/2004 | Irie | 355/53 |
| 6,785,638 B2 | 8/2004 | Niu et al. | |
| 6,891,626 B2 | 5/2005 | Niu et al. | |
| 6,943,900 B2 | 9/2005 | Niu et al. | |
| 2004/0267397 A1 | 12/2004 | Doddi et al. | |
| 2005/0084772 A1 * | 4/2005 | Ballarin | 430/5 |
| 2005/0196687 A1 * | 9/2005 | Huang et al. | 430/5 |
| 2005/0209816 A1 | 9/2005 | Vuong et al. | |
| 2005/0273753 A1 * | 12/2005 | Sezginer | 716/21 |
| 2006/0057471 A1 * | 3/2006 | Schenau et al. | 430/5 |
| 2008/0057408 A9 * | 3/2008 | Hasegawa et al. | 430/5 |

OTHER PUBLICATIONS

Li, L. (1996). "Formulation and comparison of two recursive matrix algorithms for modeling layered diffraction gratings," *Journal of the Optical Society of America A* 13:1024-1035.
Haykin, S. (1999). *Neural Networks*. 2nd edition, M. Horton ed., Prentice Hall: Upper Saddle River, New Jersey, 9 pages (Table of Contents).
Ausschnitt, C. P. (Feb. 23, 2004). "A New Approach to Pattern Metrology," *Proceedings of SPIE* 5375:51-65.

\* cited by examiner

*Primary Examiner*—Stacy A Whitmore
(74) *Attorney, Agent, or Firm*—Morrison & Foerster LLP

(57) ABSTRACT

In determining position accuracy of double exposure lithography using optical metrology, a mask is exposed to form a first set of repeating patterns on a wafer, where the repeating patterns of the first set have a first pitch. The mask is then exposed again to form a second set of repeating patterns on the wafer. The repeating patterns of the second set of repeating patterns interleave with the repeating patterns of the first set of repeating patterns. The wafer is then developed to form a first set of repeating structures from the first set of repeating patterns and a second set of repeating structures from the second set of repeating patterns. A first diffraction signal is measured of a first repeating structure from the first set of repeating structures and a second repeating structure from the second set of repeating structures, where the first repeating structure is adjacent to the second repeating structure. A second pitch between the first repeating structure and the second repeating structure is determined using the first measured diffraction signal. Position accuracy of the mask used to form the second set of repeating patterns is determined based on the determined second pitch and the first pitch.

19 Claims, 13 Drawing Sheets

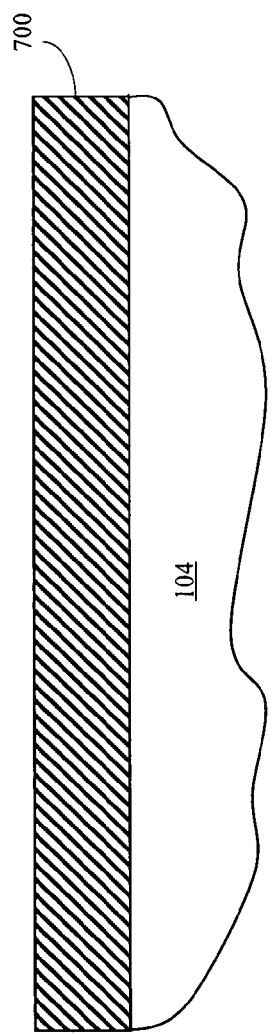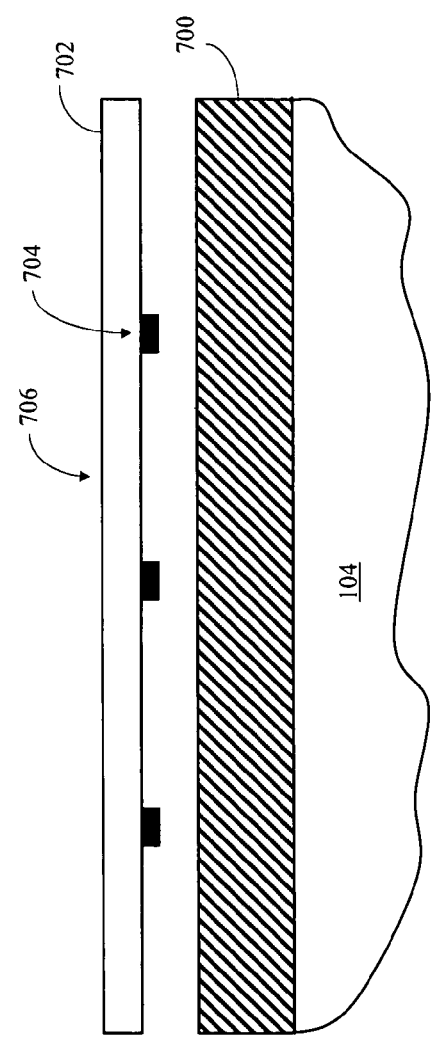

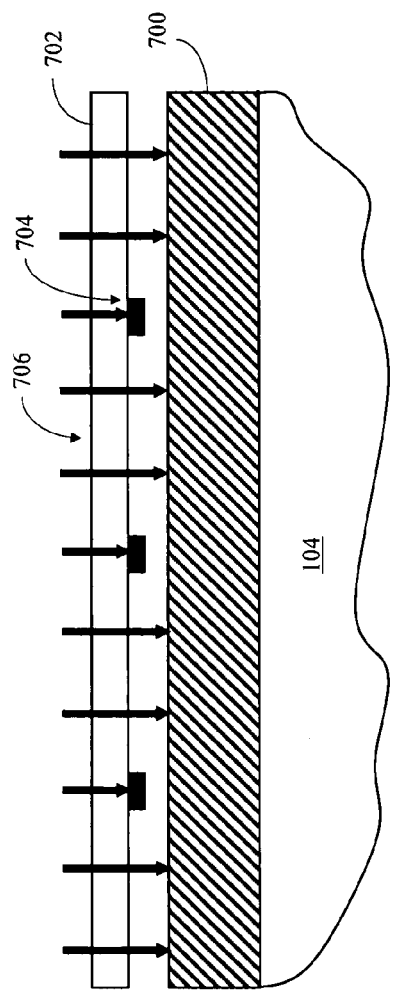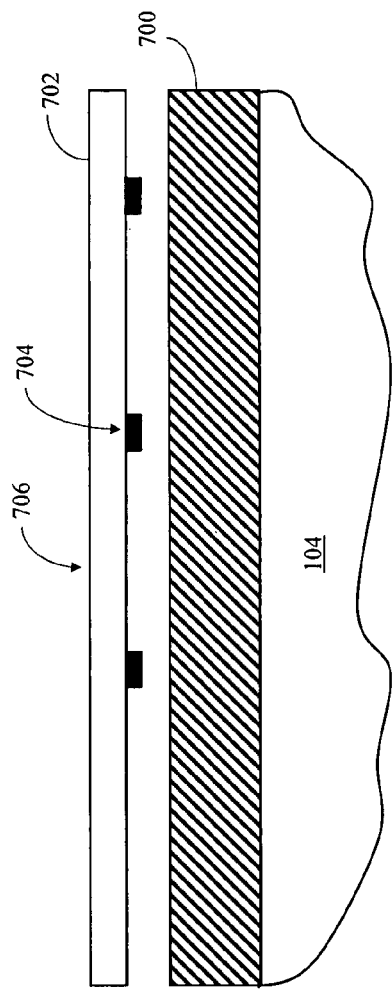

DETERMINING POSITION ACCURACY OF DOUBLE EXPOSURE LITHOGRAPHY USING OPTICAL METROLOGY

BACKGROUND

1. Field

The present application generally relates to optical metrology, and, more particularly, to determining position accuracy of double exposure lithography using optical metrology.

2. Related Art

Semiconductor devices/circuits are formed on semiconductor wafers by depositing and patterning layers of materials. In general, the features of the devices/circuits are formed onto the layers of deposited materials using a patterning process.

In a typical patterning process, the features of the devices/circuits are laid out, one layer at a time, on a series of photomasks (masks). The layout of the features of the devices/circuits on the masks are transferred, one mask at a time, onto the deposited layers of materials.

Shrinkage of device dimensions has led to the use of double exposure lithography. In double exposure lithography, a mask is exposed to form one set of features, then a second exposure is performed to print a shifted set of features, which interleaves with the first set of features. Misalignment of the second exposure, however, can adversely affect the performance of the devices/circuits formed from the sets of features. Thus, it is desirable to determine position accuracy of the mask in double exposure lithography.

SUMMARY

In one exemplary embodiment, in determining position accuracy of double exposure lithography using optical metrology, a mask is exposed to form a first set of repeating patterns on a wafer, where the repeating patterns of the first set have a first pitch. The mask is then exposed again to form a second set of repeating patterns on the wafer. The repeating patterns of the second set of repeating patterns interleave with the repeating patterns of the first set of repeating patterns. The wafer is then developed to form a first set of repeating structures from the first set of repeating patterns and a second set of repeating structures from the second set of repeating patterns. A first diffraction signal is measured of a first repeating structure from the first set of repeating structures and a second repeating structure from the second set of repeating structures, where the first repeating structure is adjacent to the second repeating structure. A second pitch between the first repeating structure and the second repeating structure is determined using the first measured diffraction signal. Position accuracy of the mask used to form the second set of repeating patterns is determined based on the determined second pitch and the first pitch.

DESCRIPTION OF DRAWING FIGURES

The present application can be best understood by reference to the following description taken in conjunction with the accompanying drawing figures, in which like parts may be referred to by like numerals:

FIGS. 7A to 7H depict one exemplary double exposure lithography process;

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

1. Optical Metrology Tools

Figure 1:
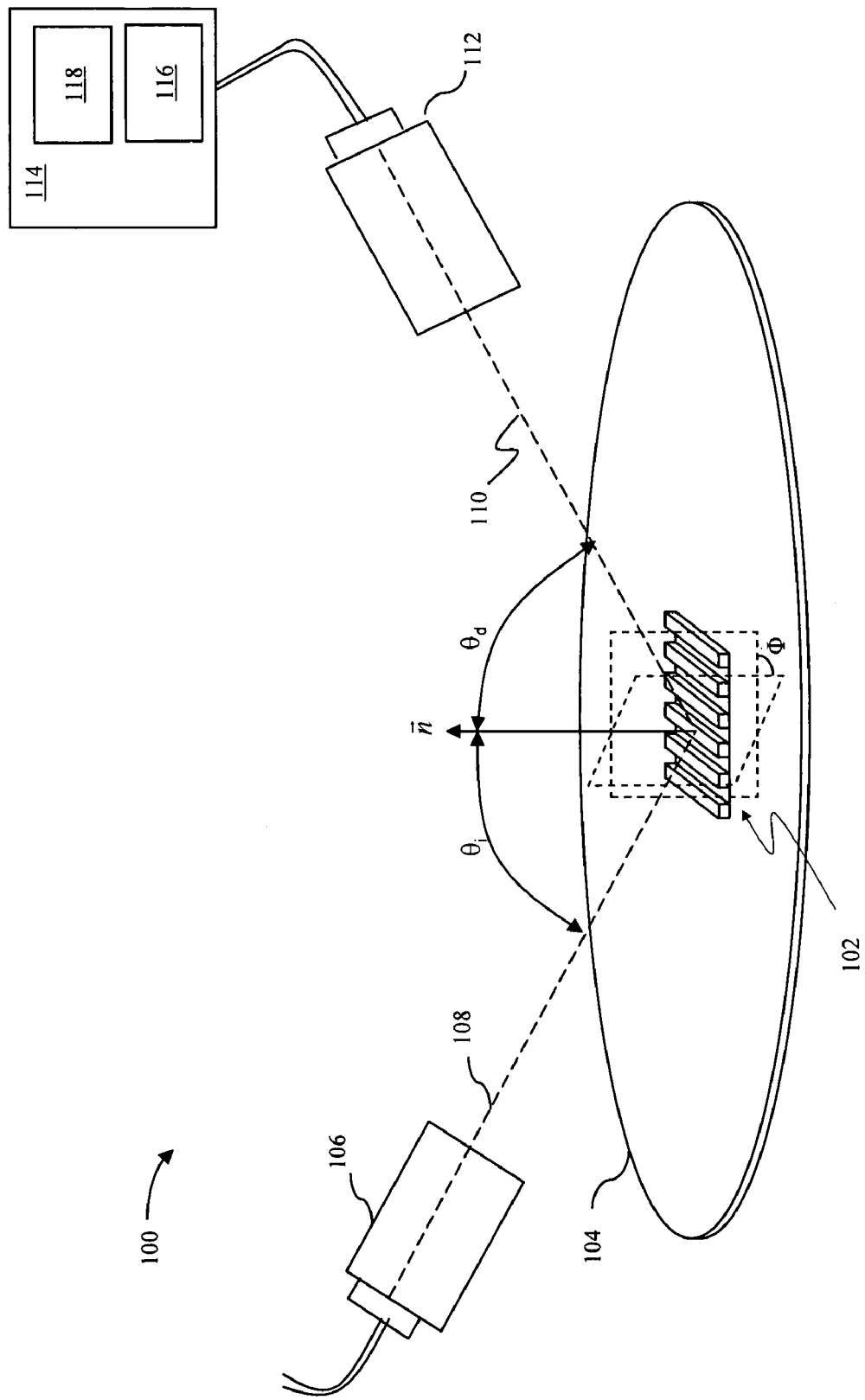
FIG. 1 depicts an exemplary optical metrology system.

With reference to FIG. 1, an optical metrology system 100 can be used to examine and analyze a structure formed on a semiconductor wafer 104. For example, optical metrology system 100 can be used to determine one or more features of a periodic grating 102 formed on wafer 104. As described earlier, periodic grating 102 can be formed in a test pad on wafer 104, such as adjacent to a die formed on wafer 104. Periodic grating 102 can be formed in a scribe line and/or an area of the die that does not interfere with the operation of the die.

As depicted in FIG. 1, optical metrology system 100 can include a photometric device with a source 106 and a detector 112. Periodic grating 102 is illuminated by an incident beam 108 from source 106. The incident beam 108 is directed onto periodic grating 102 at an angle of incidence $\theta_i$ with respect to normal $\bar{n}$ of periodic grating 102 and an azimuth angle $\Phi$ (i.e., the angle between the plane of incidence beam 108 and the direction of the periodicity of periodic grating 102). Diffracted beam 110 leaves at an angle of $\theta_d$ with respect to normal and is received by detector 112. Detector 112 converts the diffracted beam 110 into a measured diffraction signal, which can include reflectance, tan ($\Psi$), cos ($\Delta$), Fourier coefficients, and the like. Although a zero-order diffraction signal is depicted in FIG. 1, it should be recognized that non-zero orders can also be used. For example, see Ausschnitt, Christopher P., "A New Approach to Pattern Metrology," Proc. SPIE 5375-7, Feb. 23, 2004, pp 1-15, which is incorporated herein by reference in its entirety.

Optical metrology system 100 also includes a processing module 114 configured to receive the measured diffraction signal and analyze the measured diffraction signal. Processing module 114 is configured to determine one or more features of the periodic grating using any number of methods which provide a best matching diffraction signal to the measured diffraction signal. These methods are described below and include a library-based process or a regression based process using simulated diffraction signals obtained by rigorous coupled wave analysis and machine learning systems.

2. Library-Based Process of Determining Feature of Structure

In a library-based process of determining one or more features of a structure, the measured diffraction signal is compared to a library of simulated diffraction signals. More specifically, each simulated diffraction signal in the library is associated with a hypothetical profile of the structure. When a match is made between the measured diffraction signal and one of the simulated diffraction signals in the library or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, in one exemplary embodiment, after obtaining a measured diffraction signal, processing module 114 then compares the measured diffraction signal to simulated diffraction signals stored in a library 116. Each simulated diffraction signal in library 116 can be associated with a hypothetical profile. Thus, when a match is made between the measured diffraction signal and one of the simulated diffraction signals in library 116, the hypothetical profile associated with the matching simulated diffraction signal can be presumed to represent the actual profile of periodic grating 102.

The set of hypothetical profiles stored in library 116 can be generated by characterizing the profile of periodic grating 102 using a profile model. The profile model is characterized using a set of profile parameters. The profile parameters in the set are varied to generate hypothetical profiles of varying shapes and dimensions. The process of characterizing the actual profile of periodic grating 102 using profile model and a set of profile parameters can be referred to as parameterizing.

Figure 2E:
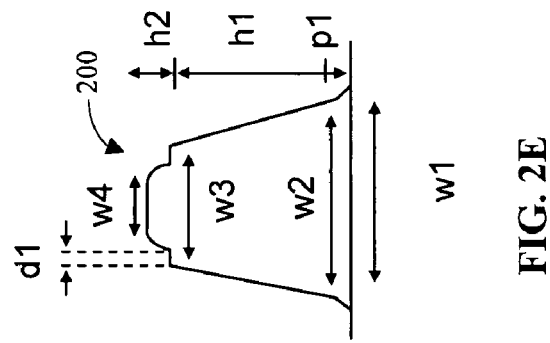
FIGS. 2A-2E depict exemplary profile models.
Figure 2C:
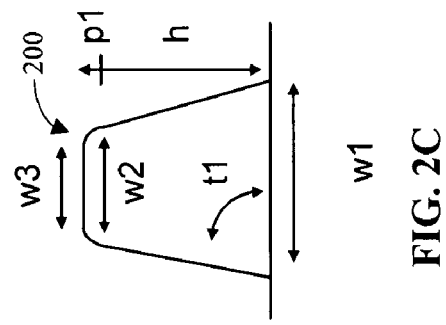
Figure 2D:
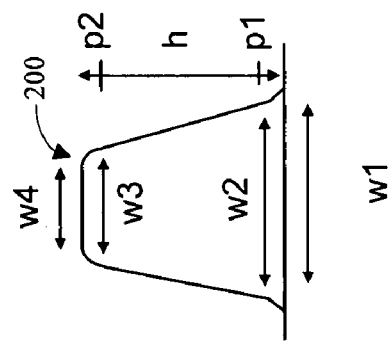
Figure 2A:
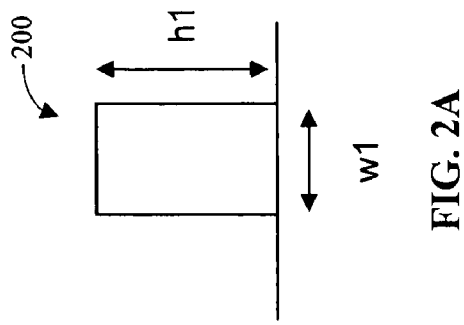
Figure 2B:
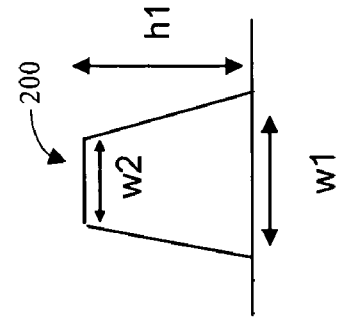

For example, as depicted in FIG. 2A, assume that profile model 200 can be characterized by profile parameters h1 and w1 that define its height and width, respectively. As depicted in FIGS. 2B to 2E, additional shapes and features of profile model 200 can be characterized by increasing the number of profile parameters. For example, as depicted in FIG. 2B, profile model 200 can be characterized by profile parameters h1, w1, and w2 that define its height, bottom width, and top width, respectively. Note that the width of profile model 200 can be referred to as the critical dimension (CD). For example, in FIG. 2B, profile parameter w1 and w2 can be described as defining the bottom CD (BCD) and top CD (TCD), respectively, of profile model 200.

As described above, the set of hypothetical profiles stored in library 116 (FIG. 1) can be generated by varying the profile parameters that characterize the profile model. For example, with reference to FIG. 2B, by varying profile parameters h1, w1, and w2, hypothetical profiles of varying shapes and dimensions can be generated. Note that one, two, or all three profile parameters can be varied relative to one another.

With reference again to FIG. 1, the number of hypothetical profiles and corresponding simulated diffraction signals in the set of hypothetical profiles and simulated diffraction signals stored in library 116 (i.e., the resolution and/or range of library 116) depends, in part, on the range over which the set of profile parameters and the increment at which the set of profile parameters is varied. The hypothetical profiles and the simulated diffraction signals stored in library 116 are generated prior to obtaining a measured diffraction signal from an actual structure. Thus, the range and increment (i.e., the range and resolution) used in generating library 116 can be selected based on familiarity with the fabrication process for a structure and what the range of variance is likely to be. The range and/or resolution of library 116 can also be selected based on empirical measures, such as measurements using AFM, X-SEM, and the like.

For a more detailed description of a library-based process, see U.S. patent application Ser. No. 09/907,488, titled GENERATION OF A LIBRARY OF PERIODIC GRATING DIFFRACTION SIGNALS, filed on Jul. 16, 2001, which is incorporated herein by reference in its entirety.

3. Regression-Based Process of Determining Feature of Structure

In a regression-based process of determining one or more features of a structure, the measured diffraction signal is compared to a simulated diffraction signal (i.e., a trial diffraction signal). The simulated diffraction signal is generated prior to the comparison using a set of profile parameters (i.e., trial profile parameters) for a hypothetical profile. If the measured diffraction signal and the simulated diffraction signal do not match or when the difference of the measured diffraction signal and one of the simulated diffraction signals is not within a preset or matching criterion, another simulated diffraction signal is generated using another set of profile parameters for another hypothetical profile, then the measured diffraction signal and the newly generated simulated diffraction signal are compared. When the measured diffraction signal and the simulated diffraction signal match or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, the processing module 114 can generate a simulated diffraction signal for a hypothetical profile, and then compare the measured diffraction signal to the simulated diffraction signal. As described above, if the measured diffraction signal and the simulated diffraction signal do not match or when the difference of the measured diffraction signal and one of the simulated diffraction signals is not within a preset or matching criterion, then processing module 114 can iteratively generate another simulated diffraction signal for another hypothetical profile. The subsequently generated simulated diffraction signal can be generated using an optimization algorithm, such as global optimization techniques, which includes simulated annealing, and local optimization techniques, which includes steepest descent algorithm.

The simulated diffraction signals and hypothetical profiles can be stored in a library 116 (i.e., a dynamic library). The simulated diffraction signals and hypothetical profiles stored in library 116 can then be subsequently used in matching the measured diffraction signal.

For a more detailed description of a regression-based process, see U.S. patent application Ser. No. 09/923,578, titled METHOD AND SYSTEM OF DYNAMIC LEARNING THROUGH A REGRESSION-BASED LIBRARY GENERATION PROCESS, filed on Aug. 6, 2001, which is incorporated herein by reference in its entirety.

4. Rigorous Coupled Wave Analysis

As described above, simulated diffraction signals are generated to be compared to measured diffraction signals. As will be described below, the simulated diffraction signals can be generated by applying Maxwell's equations and using a numerical analysis technique to solve Maxwell's equations. It should be noted, however, that various numerical analysis techniques, including variations of RCWA, can be used.

In general, RCWA involves dividing a hypothetical profile into a number of sections, slices, or slabs (hereafter simply referred to as sections). For each section of the hypothetical profile, a system of coupled differential equations is generated using a Fourier expansion of Maxwell's equations (i.e., the components of the electromagnetic field and permittivity (∈)). The system of differential equations is then solved using a diagonalization procedure that involves eigenvalue and eigenvector decomposition (i.e., Eigen-decomposition) of the characteristic matrix of the related differential equation system. Finally, the solutions for each section of the hypothetical profile are coupled using a recursive-coupling schema, such as a scattering matrix approach. For a description of a scattering matrix approach, see Lifeng Li, "Formulation and comparison of two recursive matrix algorithms for modeling layered diffraction gratings," J. Opt. Soc. Am. A13, pp 1024-1035 (1996), which is incorporated herein by reference in its entirety. For a more detail description of RCWA, see U.S. patent application Ser. No. 09/770,997, titled CACHING OF INTRA-LAYER CALCULATIONS FOR RAPID RIGOROUS COUPLED-WAVE ANALYSES, filed on Jan. 25, 2001, which is incorporated herein by reference in its entirety.

5. Machine Learning Systems

The simulated diffraction signals can be generated using a machine learning system (MLS) employing a machine learning algorithm, such as back-propagation, radial basis function, support vector, kernel regression, and the like. For a more detailed description of machine learning systems and algorithms, see "Neural Networks" by Simon Haykin, Prentice Hall, 1999, which is incorporated herein by reference in its entirety. See also U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

In one exemplary embodiment, the simulated diffraction signals in a library of diffraction signals, such as library 116 (FIG. 1), used in a library-based process are generated using a MLS. For example, a set of hypothetical profiles can be provided as inputs to the MLS to produce a set of simulated diffraction signals as outputs from the MLS. The set of hypothetical profiles and set of simulated diffraction signals are stored in the library.

In another exemplary embodiment, the simulated diffractions used in regression-based process are generated using a MLS, such as MLS 118 (FIG. 1). For example, an initial hypothetical profile can be provided as an input to the MLS to produce an initial simulated diffraction signal as an output from the MLS. If the initial simulated diffraction signal does not match the measured diffraction signal, another hypothetical profile can be provided as an additional input to the MLS to produce another simulated diffraction signal.

FIG. 1 depicts processing module 114 having both a library 116 and MLS 118. It should be recognized, however, that processing module 114 can have either library 116 or MLS 118 rather than both. For example, if processing module 114 only uses a library-based process, MLS 118 can be omitted. Alternatively, if processing module 114 only uses a regression-based process, library 116 can be omitted. Note, however, a regression-based process can include storing hypothetical profiles and simulated diffraction signals generated during the regression process in a library, such as library 116.

6. One Dimension Profiles and Two Dimension Profiles

Figure 3:
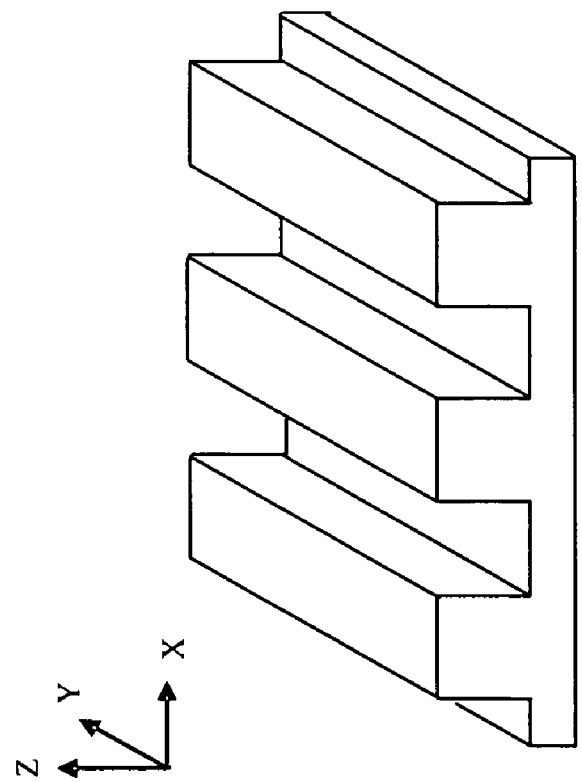
FIG. 3 depicts a repeating structure with a profile that varies only in one dimension.

The term "one-dimension structure" is used herein to refer to a structure having a profile that varies only in one dimension. For example, FIG. 3 depicts a periodic grating having a profile that varies in one dimension (i.e., the x-direction). The profile of the periodic grating depicted in FIG. 3 varies in the z-direction as a function of the x-direction. However, the profile of the periodic grating depicted in FIG. 3 is assumed to be substantially uniform or continuous in the y-direction.

Figure 4:
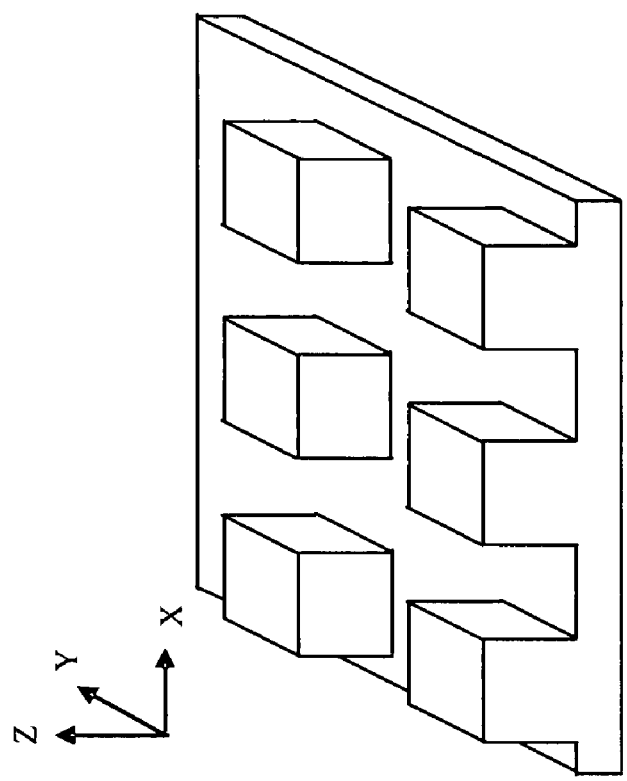
FIG. 4 depicts a repeating structure with a profile that varies in two dimensions.

The term "two-dimension structure" is used herein to refer to a structure having a profile that varies in at least two-dimensions. For example, FIG. 4 depicts a periodic grating having a profile that varies in two dimensions (i.e., the x-direction and the y-direction). The profile of the periodic grating depicted in FIG. 4 varies in the y-direction.

Discussion for FIGS. 5A, 5B, and 5C below describe the characterization of two-dimension repeating structures for optical metrology modeling. FIG. 5A depicts a top-view of exemplary orthogonal grid of unit cells of a two-dimension repeating structure. A hypothetical grid of lines is superimposed on the top-view of the repeating structure where the lines of the grid are drawn along the direction of periodicity. The hypothetical grid of lines forms areas referred to as unit cells. The unit cells may be arranged in an orthogonal or non-orthogonal configuration. Two-dimension repeating structures may comprise features such as repeating posts, contact holes, vias, islands, or combinations of two or more shapes within a unit cell. Furthermore, the features may have a variety of shapes and may be concave or convex features or a combination of concave and convex features. Referring to FIG. 5A, repeating structure 500 comprises unit cells with holes arranged in an orthogonal manner. Unit cell 502 includes all the features and components inside the unit cell 502, primarily comprising a hole 504 substantially in the center of the unit cell 502.

Figure 5B:
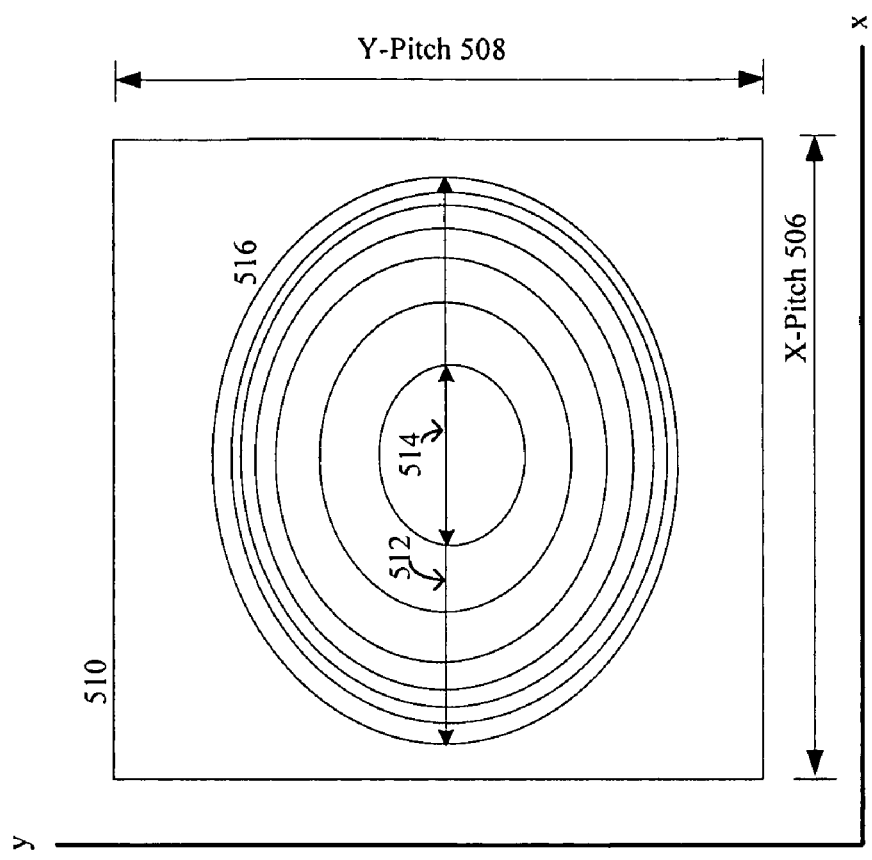
FIGS. 5A to 5C depict modeling structures with profiles that vary in two dimensions using unit cells.
Figure 5A:
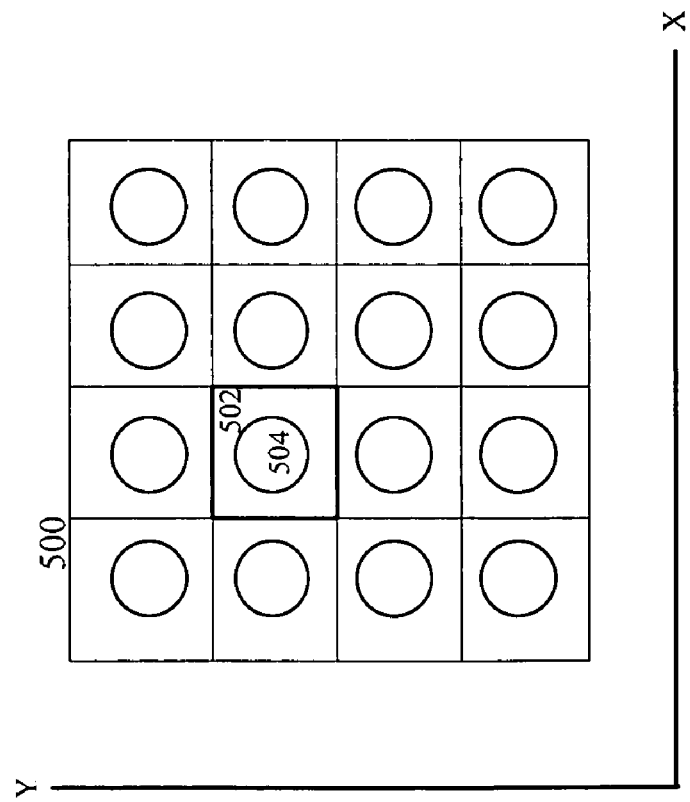

FIG. 5B depicts a top-view of a two-dimension repeating structure. Unit cell 510 includes a concave elliptical hole. FIG. 5B shows a unit cell 510 with a feature 516 that comprises an elliptical hole, where the dimensions become progressively smaller until the bottom of the hole. Profile parameters used to characterize the structure includes the X-pitch 506 and the Y-pitch 508. In addition, the major axis of the ellipse 512 that represents the top of the feature 516 and the major axis of the ellipse 514 that represents the bottom of the feature 516 may be used to characterize the feature 516. Furthermore, any intermediate major axis between the top and bottom of the feature may also be used as well as any minor axis of the top, intermediate, or bottom ellipse, (not shown).

Figure 5C:
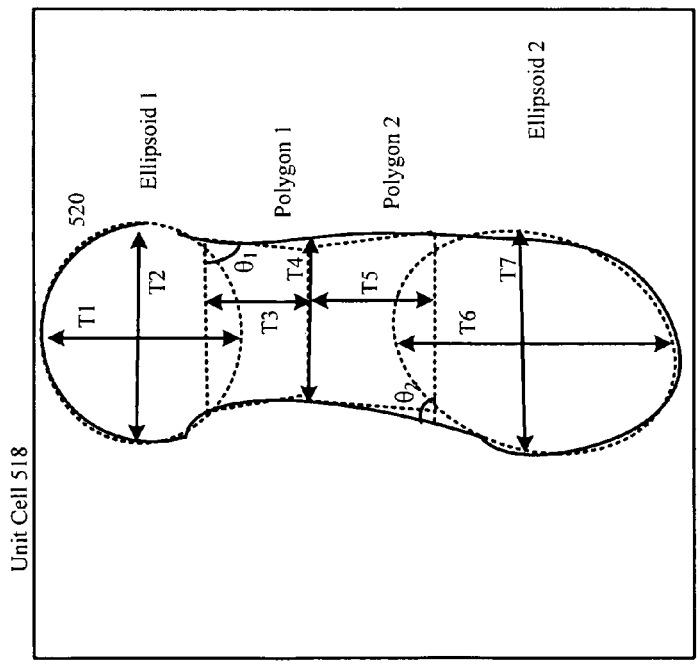

FIG. 5C is an exemplary technique for characterizing the top-view of a two-dimension repeating structure. A unit cell 518 of a repeating structure is a feature 520, an island with a peanut-shape viewed from the top. One modeling approach includes approximating the feature 520 with a variable number or combinations of ellipses and polygons. Assume further that after analyzing the variability of the top-view shape of the feature 520, it was determined that two ellipses, Ellipsoid 1 and Ellipsoid 2, and two polygons, Polygon 1 and Polygon 2 were found to fully characterize feature 520. In turn, parameters needed to characterize the two ellipses and two polygons comprise nine parameters as follows: T1 and T2 for Ellipsoid 1; T3, T4, and $\theta_1$ for Polygon 1; T4, T5, and $\theta_2$ for Polygon 2; T6 and T7 for Ellipsoid 2. Many other combinations of shapes could be used to characterize the top-view of the feature 520 in unit cell 518. For a detailed description of modeling two-dimension repeating structures, refer to U.S. patent application Ser. No. 11/061,303, OPTICAL METROLOGY OPTIMIZATION FOR REPETITIVE STRUCTURES, by Vuong, et al., filed on Apr. 27, 2004, and is incorporated in its entirety herein by reference.

7. Double Exposure Lithography

As discussed earlier, the process of fabricating semiconductor devices/circuits includes depositing and patterning layers of materials on a substrate. More particularly, the features of the semiconductor devices/circuits are formed one layer at a time by depositing a layer of material, then removing portions of the deposited layer of material.

The process of depositing the layers of material is generally referred to as a deposition process. Exemplary deposition processes include chemical vapor deposition (CVD), oxidation, spin coating, sputtering, and the like. Exemplary materials that are deposited include oxides, metals, and the like.

The process of forming features on the deposited layers of materials is generally referred to as a patterning process, which typically includes a photolithography process and an etching process. More particularly, in a typical lithographic process, the features of the semiconductor device/circuit are laid out one layer at a time on a series of photomasks (masks). A single mask typically includes the layout for one layer of one or more chips throughout a wafer.

Figure 6:
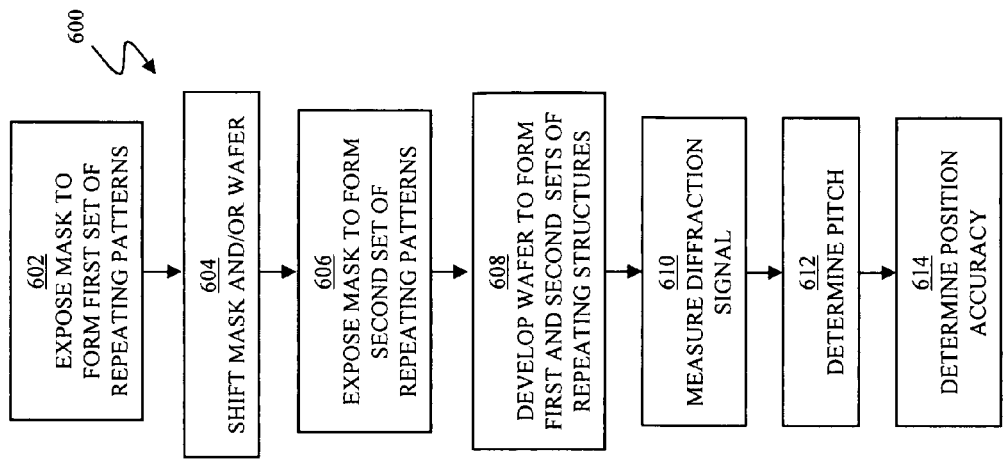
FIG. 6 depicts an exemplary process of determining position accuracy of double exposure lithography.

As described above, double exposure lithography includes exposing a mask to form one set of features, and then performing a second exposure to form a shifted set of features, which interleave with the earlier formed set of features. Note, the second exposure can be achieved by shifting the mask and/or the wafer. With reference to FIG. 6, an exemplary process 600 is depicted of determining position accuracy of double exposure lithography using optical metrology.

In step 602, a mask is exposed to form a first set of repeating patterns on a wafer. The repeating patterns of the first set have a first pitch. For example, with reference to FIG. 7A, a layer 700 is deposited on wafer 104. For the purpose of this example, assume that layer 700 is a photoresist layer. However, layer 700 can include various materials, such as oxides, metals, and the like. With reference to FIG. 7B, a mask 702 is positioned above layer 700. With reference to FIG. 7C, mask 702 is aligned relative to wafer 104 such that the features that are to be formed on layer 700 are positioned in the proper intended location. When mask 702 is properly aligned, mask 702 and portions of layer 700 are exposed to light.

As depicted in FIG. 7B, mask 702 includes portions 704 that block light and portions 706 that transmit light. Portions 704 of mask 702 that block light can be patterned to have the same shape as the features that are to be formed on layer 700. These types of masks are generally referred to as "light field" masks. Alternatively, portions 706 of mask 702 that transmit light can be patterned to have the same shape as the features that are to be formed on layer 700. These types of masks are generally referred to as "dark field" masks. For the sake of convenience and clarity, mask 702 is depicted and described as being a "light field" mask.

As depicted in FIG. 7C, when mask 702 and portions of layer 700 are exposed to light, only certain portions of layer 700 are exposed to the light, i.e., the portions under portions 706 of mask 702 that transmit light. As described above, in this example, layer 700 is a photoresist layer, which has the material characteristic that its solubility is responsive to exposure to light. More particularly, some photoresist change from a soluble to an insoluble condition when exposed to light. These types of photoresist are generally known as "negatively acting" resist. In contrast, some photoresist change from an insoluble to a soluble condition when exposed to light. These types of photoresist are generally known as "positively acting" resist. For the sake of convenience and clarity, assume that layer 700 is a "positively acting" resist.

It should be noted that mask 702 can be patterned to include the shapes of the features of one layer of the devices/circuits that are to be formed on wafer 104 (FIG. 1), and more particularly on layer 700. As such, during the process of forming repeating structures, the features of one layer of devices/circuits are also being formed on layer 700 of one or more chips throughout wafer 104.

With reference again to FIG. 6, in step 604, after exposing the mask to form the first set of repeating patterns, the mask and/or the wafer is shifted. With reference to FIG. 7D, mask 702 is shown positioned above layer 700. It should be recognized, however, that wafer 104 can be shifted, or both mask 702 and wafer 104 can be shifted.

Figure 7E:
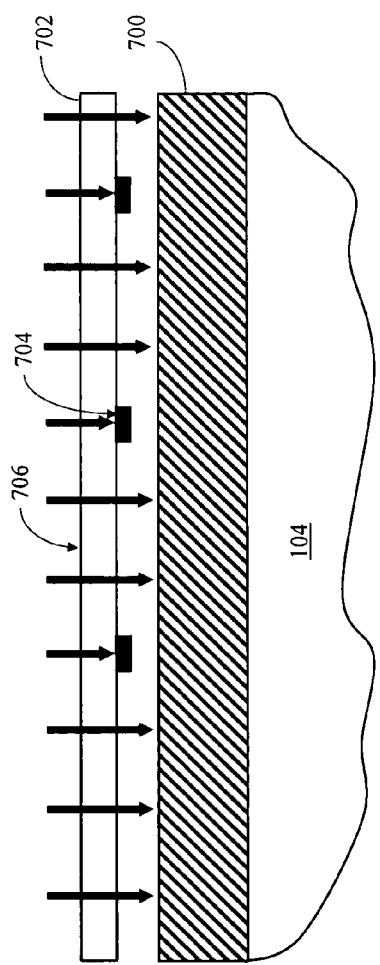

With reference again to FIG. 6, in step 606, after the mask and/or wafer has been shifted and positioned, the mask is exposed a second time to form a second set of repeating patterns on the wafer. The repeating patterns of the second set of repeating patterns interleave with the repeating patterns of the first set of repeating patterns. With reference to FIG. 7E, when mask 702 and/or wafer 104 has been shifted and properly aligned, mask 702 and portions of layer 700 are exposed to light. As depicted in FIG. 7E, only certain portions of layer 700 are exposed to the light, i.e., the portions under portions 706 of mask 702 that transmit light.

Figure 7F:
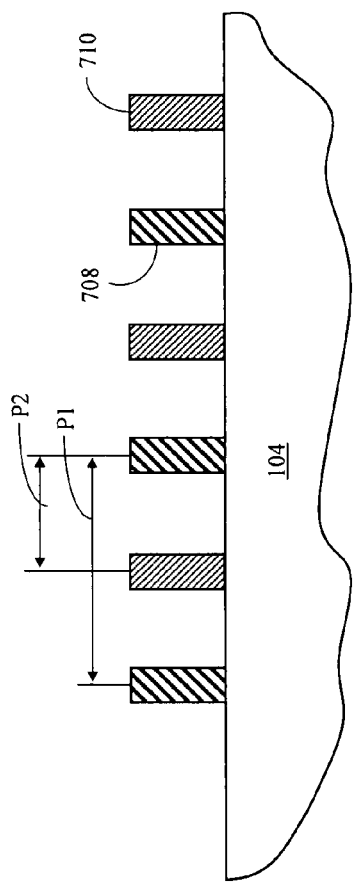

With reference again to FIG. 6, after the mask has been exposed twice to form the first and second sets of repeating patterns, in step 608, the wafer is developed to form a first set of repeating structures from the first set of repeating patterns and a second set of repeating structures from the second set of repeating patterns. With reference to FIG. 7E, when layer 700 is exposed to an appropriate chemical solvent (i.e., a developer), the portions of layer 700 that were exposed to the light are dissolved. Thus, as depicted in FIG. 7F, a first set of repeating structures 708 are formed from the first set of repeating patterns formed on layer 700 (FIG. 7E), and a second set of repeating structures 710 are formed from the second set of repeating patterns formed on layer 700 (FIG. 7E). As depicted in FIG. 7F, repeating structures 708 are spaced regularly with a pitch of P1. Repeating structures 710 are interleaved with repeating structure 708. One repeating structure 710 is spaced from one repeating structure 708 with a pitch of P2.

Figure 7G:
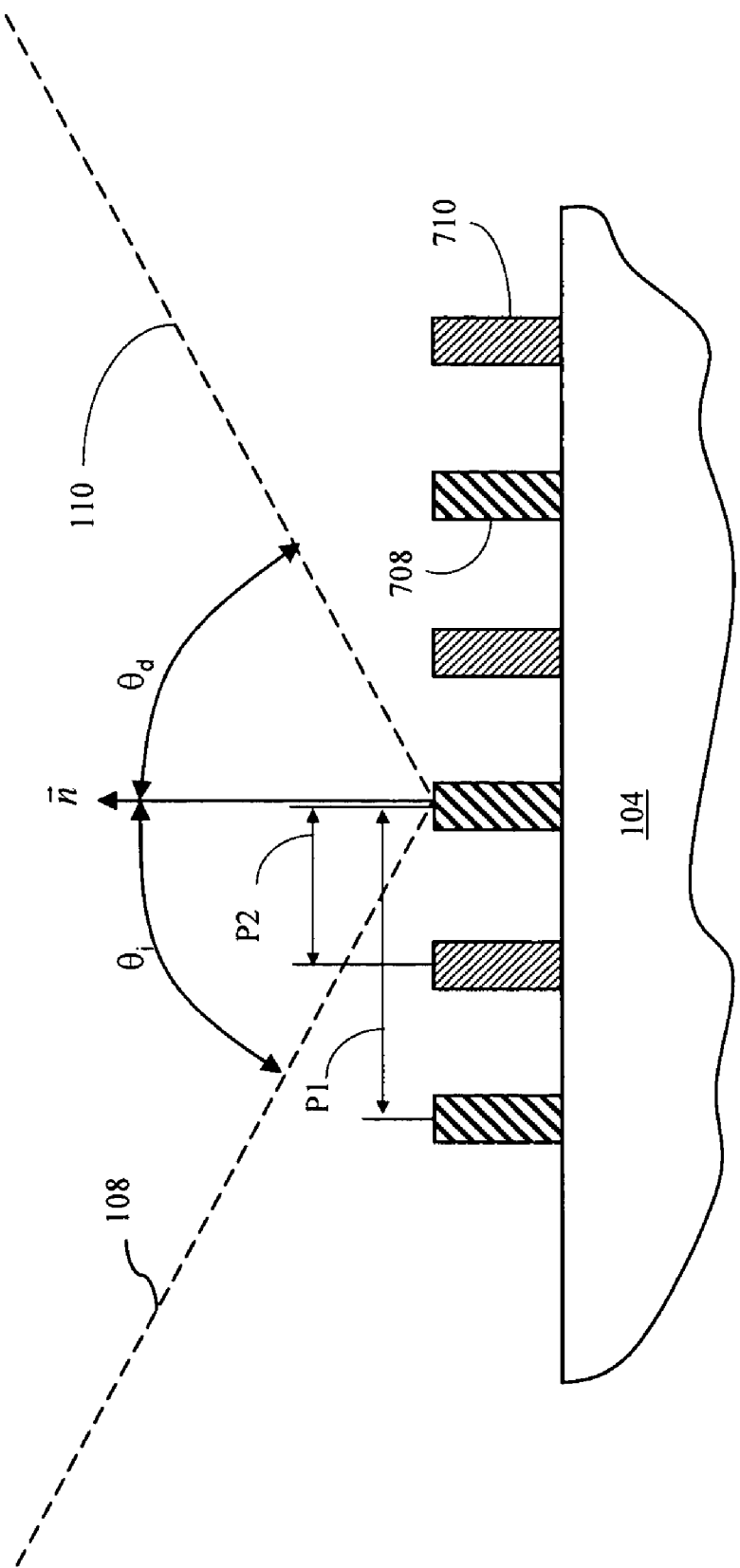

With reference to FIG. 6, in step 610, a diffraction signal is measured of a first repeating structure from the first set of repeating structures and a second repeating structure from the second set of repeating structures. In the present exemplary embodiment, the diffraction signal is measured using an optical metrology tool. FIG. 7G, depicts incident beam 108 as being incident on repeating structure 708, and diffraction beam 110 as being diffracted from repeating structure 708. It should be recognized, however, that incident beam 108 has a spot size that typically covers multiple periods of repeating structures 708 and 710. For the purpose of the present application, the spot size only needs to be sufficient to obtain a diffraction signal of at least one repeating structure 708 and one adjacent repeating structure 710. As described above, a measured diffraction signal is converted from diffraction beam 110.

With reference to FIG. 6, in step 612, the measured diffraction signal is used to determine the pitch between the first repeating structure from the first set of repeating structures and the second repeating structure from the second set of repeating structures. As depicted in FIG. 7G, pitch P2 corresponds to the pitch between repeating structure 708 and repeating structure 710, which is adjacent to repeating structure 708. As described above, pitch P2 can be determined from the measured diffraction signal using a regression-based or library-based process of optical metrology.

Figure 7H:
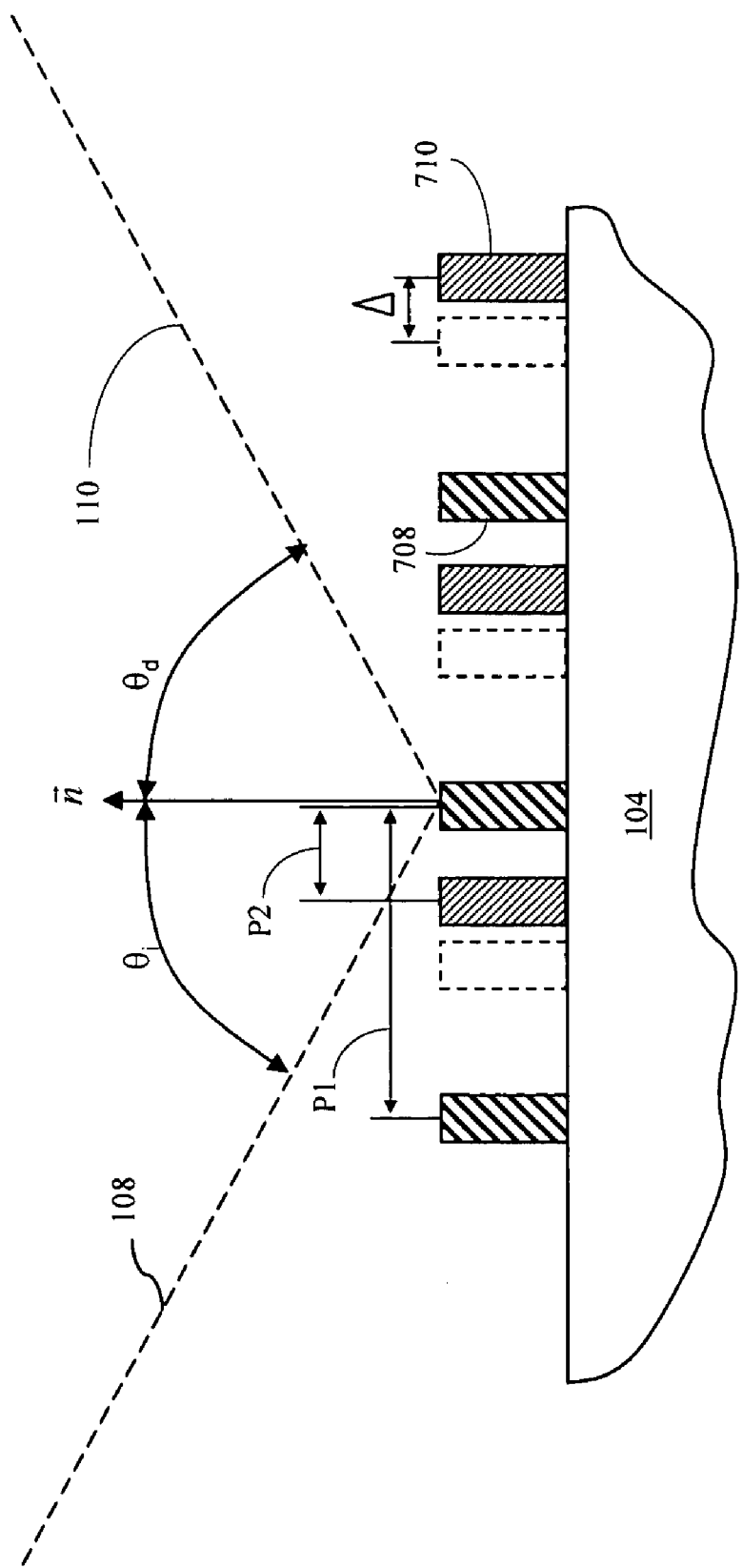

With reference to FIG. 6, in step 614, the pitch between the repeating structures of the first set of repeating structures and the pitch between the first repeating structure and the second repeating structure are used to determine the position accuracy of the mask used to form the second set of repeating structures. With reference to FIG. 7G, if pitch P2 is determined to be half of pitch P1, then the position of the mask is determined to have been aligned properly. With reference to FIG. 7H, if pitch P2 is determined not to be half of pitch P1, then the position of the mask is determined to have been misaligned. Note, in FIG. 7H, assume that the dotted outline of repeating structure 710 depict the location where pitch P2 is half of pitch P1. Thus, offset A indicates the amount by which the mask was misaligned. As mentioned above, the mask and/or the wafer can be shifted to form the second repeating structure. Thus, the mask used to form the second set of repeating structure can be aligned or misaligned as a result of shifting only the mask, shifting only the wafer, or shifting both the mask and the wafer.

Although repeating structures 708 and 710 have been depicted and described as being formed directly on wafer 104, it should be noted that repeating structures 708 and 710 can be formed on an intermediate layer formed on wafer 104.

As described above, pitch P2 can be determined from the measured diffraction signal using a regression-based or library-based process of optical metrology. As also described above, in optical metrology, a profile model is used to characterize the structure to be examined. In one exemplary embodiment, when repeating structures 708 and 710 are line-space structures as depicted in FIG. 7F, repeating structures 708 and 710 can be modeled as spacers, and the width of the air gap between repeating structures 708 and 710 corresponds to pitch P2.

Figure 8:
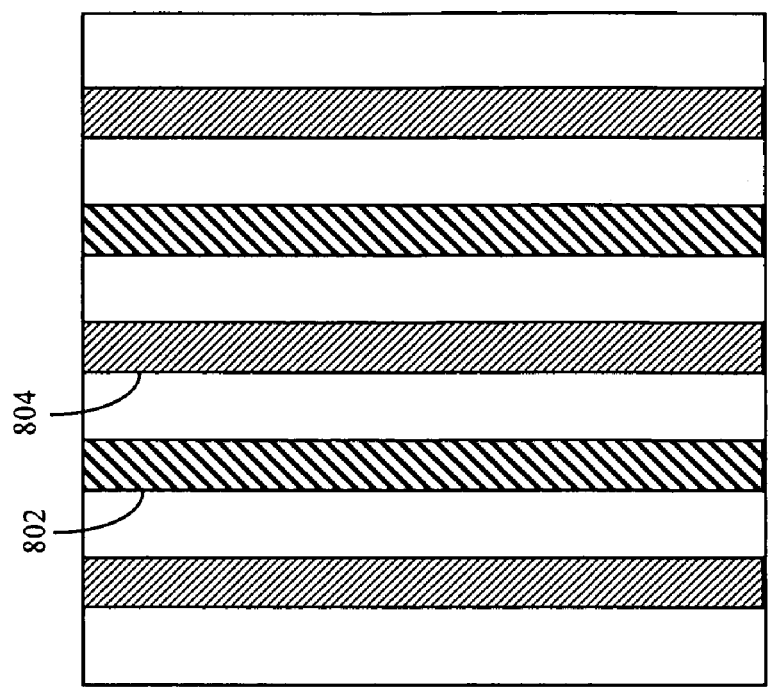
FIG. 8 depicts sets of repeating structures running in orthogonal directions.
Figure 8:
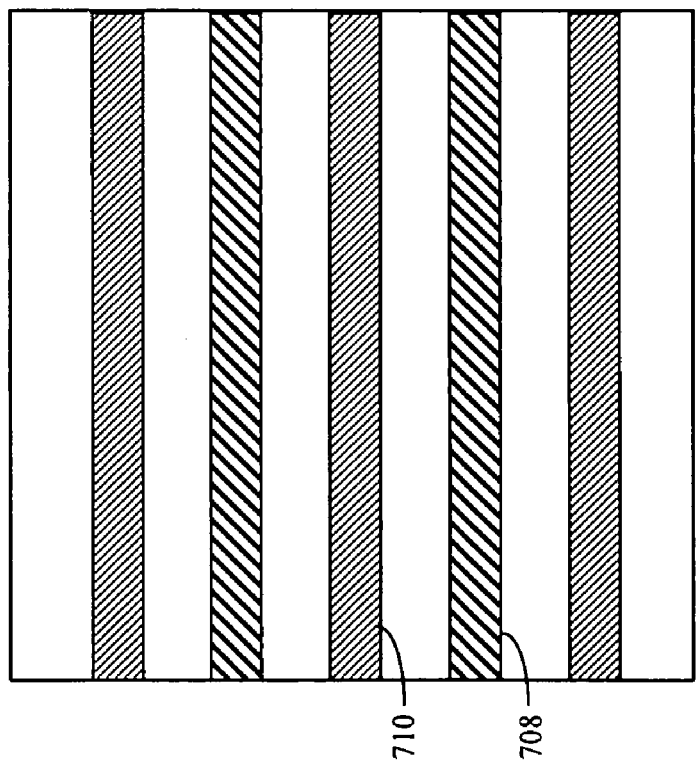

With continued reference to FIG. 8, when repeating structures 708 and 710 are line space structures, in one exemplary embodiment, repeating structures 708 and 710 are oriented in one direction. As depicted in FIG. 8, another set of repeating structures 802 and set of repeating structures 804 are formed. Repeating structures 802 and 804 are oriented in a direction orthogonal to repeating structures 708 and 710. Repeating structures 708, 710, 802, and 804 can be used to determine position accuracy of the mask in the two orthogonal directions.

In particular, with reference to FIG. 6, before step 608, the mask is exposed to form a third set of repeating patterns. The repeating patterns of the third set have a third pitch. After exposing the mask to form a third set of repeating patterns and before step 608, the mask and/or wafer is shifted. The mask is then exposed again to form a fourth set of repeating structures. The repeating patterns of the fourth set of repeating patterns interleave with the repeating patterns of the third set of repeating patterns. When the wafer is developed in step 608, a third set of repeating structures is formed from the third set of repeating patterns, and a fourth set of repeating structures is formed from the fourth set of repeating patterns. A diffraction signal is measured from a repeating structure from the third set of repeating structures and a repeating structure from the fourth set of repeating structures. A fourth pitch is determined between the repeating structure from the third set and the repeating structure from the fourth set. The position accuracy of the mask is determined based on the determined fourth pitch and the third pitch.

Thus far, repeating structures have been depicted as having profiles that vary only in one dimension. It should be recognized, however, that the repeating structures can have profiles that vary in two dimensions, and that the processes described above can apply to these structures.

Figure 9B:
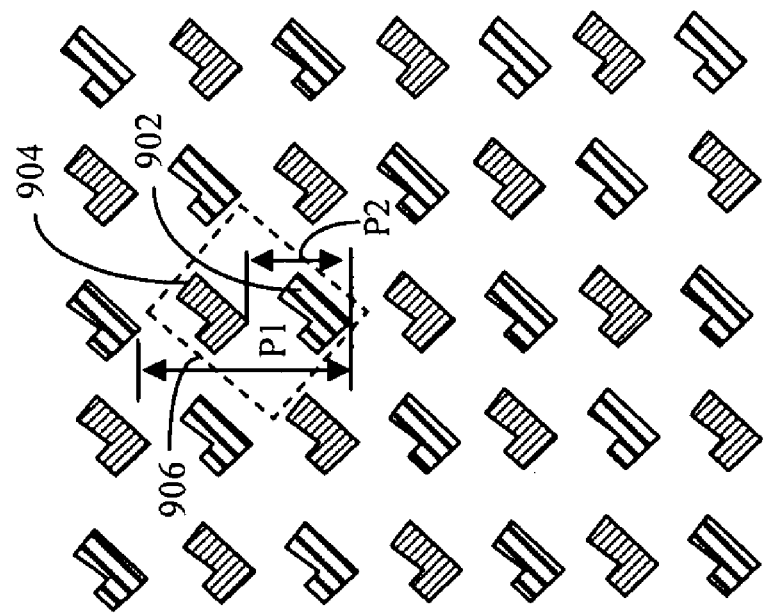
FIGS. 9A and 9B depict repeating structures with profiles that vary in two dimensions.
Figure 9A:
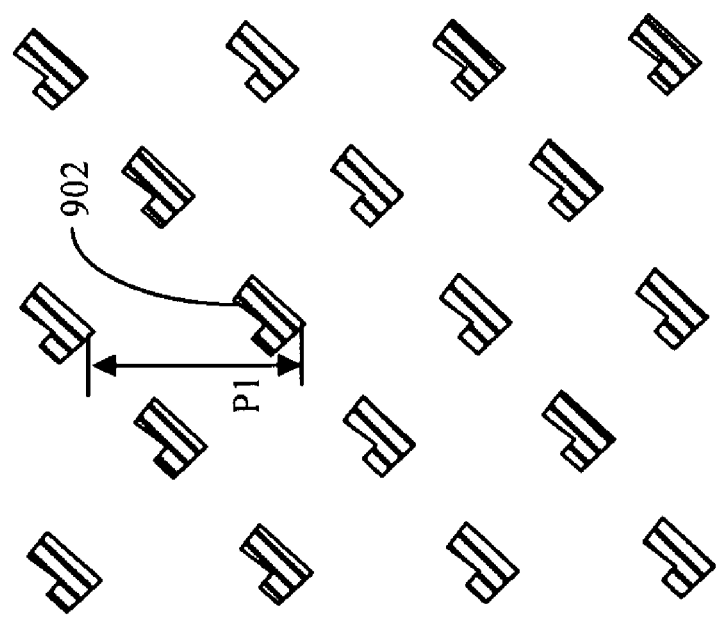

More particularly, with reference to FIG. 9A, a top view of a set of repeating structures 902 with profiles that vary in two dimensions is depicted. Repeating structures 902 have pitch P1. As depicted in FIG. 9B, the mask used to form set of repeating structures 902 can be shifted and/or the wafer can be shifted to form another set of repeating structures 904 that interleave with set of repeating structures 902. A diffraction signal can be measured of at least one repeating structure from set of repeating structures 902 and at least one repeating structure from set of repeating structures 904. Pitch P2 can be determined from the measured diffraction signal using a regression-based or library-based process of optical metrology. As described above, repeating structures 902 and 904 can be modeled for optical metrology using a unit cell 906. As described above, position accuracy of the mask can be determined based on pitch P1 and P2.

Figure 10:
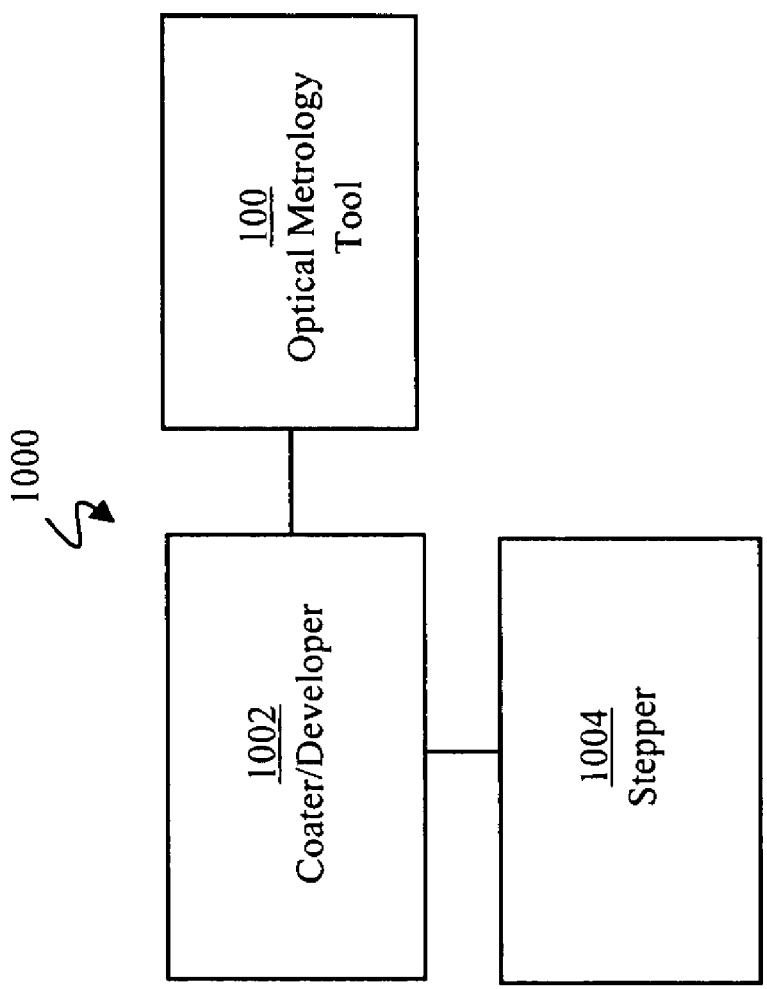
FIG. 10 depicts a wafer processing system.

With reference to FIG. 10, an integrated wafer processing and metrology system 1000 includes a coater/developer 1002, a stepper 1004, and optical metrology tool 100. Coater/developer 1002 is configured to deposit layers on a wafer and develop the wafer. Stepper 1004 is configured to expose a mask to form repeating patterns on the deposited layers on the wafer. Stepper 1004 is also configured to shift the mask and/or the wafer. Optical metrology tool 100 is configured to measure a diffraction signal from the wafer.

In particular, stepper 1004 is configured to expose a mask to form a first set of repeating patterns and a second set of repeating structures on a wafer. The repeating patterns of the first set have a first pitch, and the repeating patterns of the second set of repeating patterns interleave with the repeating patterns of the first set of repeating patterns. Stepper 1004 is also configured to shift the mask and/or the wafer after the mask is exposed to form the first set of repeating patterns to expose the mask to form the second set of repeating patterns. Coater/developer 1002 is configured to deposit one or more layers on the wafer. The first and second sets of repeating patterns are formed on the one or more layers. Coater/developer 1002 is configured to develop the wafer after the first and second sets of repeating patterns are formed on the one or more layers to form a first set of repeating structures from the first set of repeating patterns and a second set of repeating structures from the second set of repeating patterns. Optical metrology tool 100 is configured to measure a diffraction signal of a first repeating structure from the first set of repeating structures and a second repeating structure from the second set of repeating structures, where the first repeating structure is adjacent to the second repeating structure. Optical metrology tool 100 is configured to determine a second pitch between the first repeating structure and the second repeating structure using the measured diffraction signal. Optical metrology tool 100 is configured to determine position accuracy of the mask used to form the second set of repeating patterns based on the determined second pitch and the first pitch.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching.

We claim:

1. A method of determining position accuracy of double exposure lithography using optical metrology, the method comprising:
   a) exposing a mask to form a first set of repeating patterns on a wafer, wherein the repeating patterns of the first set have a first pitch;
   b) after a), exposing the mask to form a shifted second set of repeating patterns on the wafer, wherein the repeating patterns of the second set of repeating patterns interleave with the repeating patterns of the first set of repeating patterns;

c) after b), developing the wafer to form a first set of repeating structures from the first set of repeating patterns and a second set of repeating structures from the second set of repeating patterns;

d) measuring a first diffraction signal of a first repeating structure from the first set of repeating structures and a second repeating structure from the second set of repeating structures, wherein the first repeating structure is adjacent to the second repeating structure;

e) determining a second pitch between the first repeating structure and the second repeating structure using the first measured diffraction signal; and f) determining position accuracy of the mask used to form the second set of repeating patterns based on the determined second pitch and the first pitch, wherein the position of the mask is determined to have been misaligned if the second pitch is not half of the first pitch, and wherein the position of the mask is determined to have been aligned properly if the second pitch is half of the first pitch.

2. The method of claim 1, further comprising:
when the second pitch is not half of the first pitch, determining an amount of misalignment of the mask based on the difference between the second pitch and half of the first pitch.

3. The method of claim 1, wherein the repeating structures of the first and second sets of repeating structures are line and space structures.

4. The method of claim 3, wherein an air gap with a width exists between the first and second repeating structures, wherein the first and second repeating structures are modeled as spacers, and wherein the width of the air gap is determined as the second pitch.

5. The method of claim 1, further comprising:
g) before c), exposing the mask to form a third set of repeating patterns, wherein the repeating patterns of the third set have a third pitch;

h) after g) and before c), exposing the mask to form a fourth set of repeating patterns, wherein the repeating patterns of the fourth set of repeating patterns interleave with the repeating patterns of the third set of repeating patterns, wherein, when the wafer is developed in c), a third set of repeating structures is formed from the third set of repeating patterns and a fourth set of repeating structures is formed from the fourth set of repeating patterns;

i) after c), measuring a second diffraction signal of a third repeating structure from the third set of repeating structures and a fourth repeating structure from the fourth set of repeating structures, wherein the third repeating structure is adjacent to the fourth repeating structure;

j) determining a fourth pitch between the third repeating structure and the fourth repeating structure using the second measured diffraction signal; and k) determining position accuracy of the mask used to form the fourth set of repeating patterns based on the determined fourth pitch and the third pitch.

6. The method of claim 5, wherein the repeating structures of the first, second, third, and fourth sets of repeating structures are line and space structures.

7. The method of claim 6, wherein the line and space structures of the first and second sets of repeating structures are oriented in a first direction, and wherein line and space structures of the third and fourth sets of repeating structures are oriented in a second direction, wherein the first and second directions are orthogonal.

8. The method of claim 1, wherein the repeating structures of the first and second sets of repeating structures are structures with profiles that vary in two or more dimensions.

9. The method of claim 8, wherein a unit cell is used to model the structures with profiles that vary in two or more dimensions.

10. The method of claim 1, wherein the first diffraction signal is measured using an optical metrology tool.

11. The method of claim 1, further comprising:
after a) and before b), shifting the mask and/or the wafer.

12. A computer-readable medium containing computer-executable instructions for determining position accuracy of double exposure lithography using optical metrology, comprising instructions for:

a) obtaining a first measured diffraction signal of a first repeating structure from a first set of repeating structures and a second repeating structure from a second set of repeating structures, wherein the first repeating structure is adjacent to the second repeating structure, wherein the first set of repeating structures is formed from a first set of repeating patterns and the second set of repeating structures is formed from a second set of repeating patterns, wherein the repeating patterns of the first set of repeating patterns has a first pitch, wherein the first set of repeating patterns is formed by exposing a mask; and wherein the second set of repeating patterns is formed by exposing the mask again after the mask was exposed to form the first set of repeating patterns;

b) determining a second pitch between the first repeating structure and the second repeating structure using the first measured diffraction signal; and c) determining position accuracy of the mask used to form the second set of repeating patterns based on the determined second pitch and the first pitch, wherein the position of the mask is determined to have been misaligned if the second pitch is not half of the first pitch, and wherein the position of the mask is determined to have been aligned properly if the second pitch is half of the first pitch.

13. The computer-readable medium of claim 12, further comprising instructions for:
when the second pitch is not half of the first pitch, determining an amount of misalignment of the mask based on the difference between the second pitch and half of the first pitch.

14. The computer-readable medium of claim 12, wherein the repeating structures of the first and second sets of repeating structures are line and space structures, wherein an air gap with a width exists between the first and second repeating structures, wherein the first and second repeating structures are modeled as spacers, and wherein the width of the air gap is determined as the second pitch.

15. The computer-readable medium of claim 12, further comprising instructions for:
d) obtaining a second measured diffraction signal of a third repeating structure from a third set of repeating structures and a fourth repeating structure from a fourth set of repeating structures, wherein the third repeating structure is adjacent to the fourth repeating structure, wherein the third set of repeating structures is formed from a third set of repeating patterns and the fourth set of repeating structures is formed from a fourth set of repeating patterns, wherein the repeating patterns of the third set of repeating patterns has a third pitch, wherein the third set of repeating patterns is formed by exposing the mask; and wherein the fourth set of repeating patterns is formed by exposing the mask again after the mask was exposed to form the third set of repeating patterns;

e) determining a fourth pitch between the third repeating structure and the fourth repeating structure using the second measured diffraction signal; and f) determining position accuracy of the mask used to form the fourth set of repeating patterns based on the determined fourth pitch and the third pitch.

16. The computer-readable medium of claim 15, wherein the repeating structures of the first, second, third, and fourth sets of repeating structures are line and space structures, wherein the line and space structures of the first and second sets of repeating structures are oriented in a first direction, and wherein line and space structures of the third and fourth sets of repeating structures are oriented in a second direction, wherein the first and second directions are orthogonal.

17. The computer-readable medium of claim 12, wherein the repeating structures of the first and second sets of repeating structures are structures with profiles that vary in two or more dimensions, and wherein a unit cell is used to model the structures with profiles that vary in two or more dimensions.

18. An integrated wafer processing and metrology system to determine position accuracy of dual exposure lithography using optical metrology, the system comprising:

a stepper configured to expose a mask to form a first set of repeating patterns on a wafer, and expose the mask again to form a second set of repeating structures on the wafer, wherein the repeating patterns of the first set have a first pitch, wherein the repeating patterns of the second set of repeating patterns interleave with the repeating patterns of the first set of repeating patterns;

a coater/developer connected to the stepper, wherein the coater/developer is configured to deposit one or more layers on the wafer, wherein the first and second sets of repeating patterns are formed on the one or more layers, and wherein the coater-developer is configured to develop the wafer after the first and second sets of repeating patterns are formed on the one or more layers to form a first set of repeating structures from the first set of repeating patterns and a second set of repeating structures from the second set of repeating patterns; and an optical metrology tool connected to the coater/developer, wherein the optical metrology tool is configured to measure a diffraction signal of a first repeating structure from the first set of repeating structures and a second repeating structure from the second set of repeating structures, wherein the first repeating structure is adjacent to the second repeating structure, wherein the optical metrology tool is configured to determine a second pitch between the first repeating structure and the second repeating structure using the measured diffraction signal, and wherein the optical metrology tool is configured to determine position accuracy of the mask used to form the second set of repeating patterns based on the determined second pitch and the first pitch, wherein the position of the mask is determined to have been misaligned if the second pitch is not half of the first pitch, and wherein the position of the mask is determined to have been aligned properly if the second pitch is half of the first pitch.

19. The system of claim 18, wherein the stepper is configured to shift the mask and/or the wafer.

* * * * *